United States Patent [19]
Fukuyama et al.

[11] Patent Number: 5,949,130
[45] Date of Patent: Sep. 7, 1999

[54] SEMICONDUCTOR INTEGRATED CIRCUIT DEVICE EMPLOYING INTERLAYER INSULATING FILM WITH LOW DIELECTRIC CONSTANT

[75] Inventors: Shun-ichi Fukuyama; Yoshihiro Nakata; Azuma Matsuura; Tomoaki Hayano, all of Kawasaki, Japan

[73] Assignee: Fujitsu Limited, Kanagawa, Japan

[21] Appl. No.: 09/025,323

[22] Filed: Feb. 18, 1998

[30] Foreign Application Priority Data

Sep. 17, 1997 [JP] Japan ................................. 9-252467

[51] Int. Cl.⁶ ................................................. H01L 23/29
[52] U.S. Cl. ...................... 257/632; 528/31; 252/62.3 R; 252/62.3 Q
[58] Field of Search ............................. 257/632; 528/31; 252/62.3 R, 62.3 Q

[56] References Cited

U.S. PATENT DOCUMENTS

| 4,723,978 | 2/1988 | Clodgo et al. ........................... 65/31 |
| 4,756,977 | 7/1988 | Haluska et al. ........................ 428/704 |
| 5,286,572 | 2/1994 | Clodgo et al. ........................... 428/447 |
| 5,416,190 | 5/1995 | Mine et al. ............................... 528/492 |
| 5,486,564 | 1/1996 | Mine et al. ............................... 524/588 |
| 5,516,858 | 5/1996 | Morita et al. ........................... 525/478 |
| 5,776,235 | 7/1998 | Camilletti et al. .................... 106/287.1 |
| 5,866,197 | 2/1999 | Bremmer et al. ......................... 427/96 |

FOREIGN PATENT DOCUMENTS

| 6-224330 | 8/1994 | Japan . |
| 7-41550 | 2/1995 | Japan . |
| 7-62103 | 3/1995 | Japan . |

Primary Examiner—Jerome Jackson, Jr.
Assistant Examiner—Bradley William Baumeister
Attorney, Agent, or Firm—Armstrong, Westerman, Hattori, McLeland & Naughton

[57] ABSTRACT

A plurality of lines are formed on the principal face of a substrate. An insulating film is formed on the principal surface of this substrate so as to cover the lines. This insulating film consists of a material which contains a low-dielectric constant composition having caged molecular structural units. Spaces of thin electron clouds delineate the centers of the caged molecular structural units. The dielectric constant is accordingly lower than that of denser materials.

5 Claims, 5 Drawing Sheets

SEMICONDUCTOR INTEGRATED CIRCUIT DEVICE EMPLOYING INTERLAYER INSULATING FILM WITH LOW DIELECTRIC CONSTANT

This application is based on Japanese Patent Application No. 9-252467 filed on Sep. 17, 1997, the entire contents of which are incorporated herein by reference.

BACKGROUND OF THE INVENTION a) Field of the Invention

The present invention relates to a semiconductor integrated circuit device, and more particularly to a semiconductor integrated circuit device effective for achieving high-speed operation in a semiconductor integrated circuit device, and to a method for the manufacture thereof.

The speed of signal propagation through multilayer wiring in a semiconductor integrated circuit is determined by the resistance of the lines and the parasitic capacitance between lines. In highly integrated semiconductor integrated circuits, the line pitch (line and space) is small, resulting in higher parasitic capacitance between lines. The parasitic capacitance between lines in a given wiring layer can be reduced by making the lines thinner, but making the lines thinner increases resistance in the lines, with the result that large scale semiconductor integrated circuit device operating speeds cannot be achieved.

In order to reduce parasitic capacitance without making the lines thinner, it is necessary to reduce the dielectric constant of the interlayer dielectric films. Where the line spacing is 0.5 $\mu$m or smaller, the interlayer insulating film dielectric constant is a significant factor controlling the signal propagation delay, and can be expected to affect semiconductor integrated circuit device performance.

b) Description of the Related Art

The interlayer dielectric films used in semiconductor integrated circuit devices are predominantly silicon dioxide films, phosphosilicate glass (PSG), which are deposited through chemical vapor deposition (CVD). The relative dielectric constant of such films varies with the conditions under which a film is formed; that of silicon thermal oxidation films, which have the lowest dielectric constant, is on the order of 4.0. Insulating films formed by spin-on-glass coating (SOG films) are highly hygroscopic and have relative dielectric constants of 5 or higher.

In recent years, polymeric materials consisting of Teflon (polytetrafluoroethylene) or hydrocarbon, have attracted attention as low-dielectric constant insulating materials. Teflon materials, however, are somewhat impractical in terms of heat resistance and low adhesion with other materials. Hydrocarbon materials are also somewhat impractical since they are readily oxidized and absorb moisture if oxidized, resulting in fluctuations in the dielectric constant.

Attempts have been made to reduce the dielectric constant by introducing fluorine atoms into an inorganic film deposited by CVD. However, the introduction of fluorine atoms in large amounts increases the hygroscopic, so the dielectric constant that can be achieved in actual practice is on the order of 3.5.

SUMMARY OF THE INVENTION

It is an object of the present invention to provide a semiconductor integrated circuit device comprising insulating films having a low dielectric constant, and a method for the manufacture thereof.

According to a first aspect of the present invention, there is provided a semiconductor integrated circuit device comprising a substrate having a plurality of lines formed on its principal surface, and an insulating film containing a low-dielectric constant composition with molecular structural units of cage form, formed on the principal surface of the substrate such as to insulate the lines.

Spaces which delineate thin electron clouds are located within the centers of the caged molecular structural units. Thus, the dielectric constant is lower than that of denser materials.

According to another aspect of the present invention, there is provided a method for manufacturing a semiconductor integrated circuit device, comprising a step in which a polymer solution containing a dissolved caged siloxane polymer is applied to a principal surface of a substrate having a plurality of lines formed on its principal surface; a step in which the substrate is subjected to heat treatment at a temperature such that some of the plurality of Si—H in the caged siloxane polymer are converted to Si—OH; and a step in which the Si—OH of the caged siloxane polymer are crosslinked.

The polymer produced through crosslinking of caged siloxane has a low dielectric constant due to the caged molecular structure.

By using these low-dielectric constant dielectrics as interlayer dielectrics for multilayer wiring, parasitic capacitance between lines can be reduced, and propagation delays can be prevented.

DETAILED DESCRIPTION OF THE PREFERRED EMBODIMENT

Figure 1A:
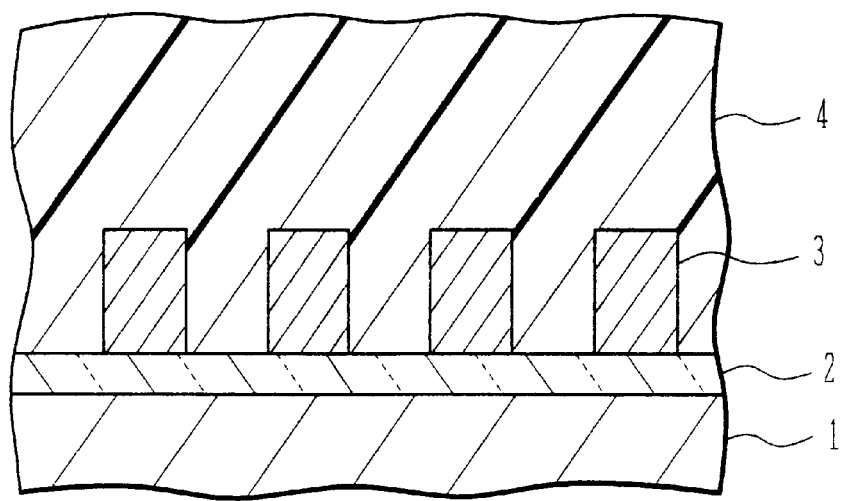
FIGS. 1A and 1B are section views of wiring layers, illustrating the method for manufacturing wiring structure in an embodiment of the present invention.

Referring to FIG. 1, the method for manufacturing a wiring structure employing the low-dielectric constant insulating film which pertains to an embodiment of the present invention will be described.

An insulating film 2 consisting of $SiO_2$ is formed on the principal surface of a silicon substrate 1. A plurality of aluminum lines 3 disposed parallel to each other are formed on the insulating film 2. The aluminum lines 3 are 0.6 $\mu$m thick; line width and spacing are each 0.4 $\mu$m.

An insulating film 4 having a low dielectric constant is formed so as to insulate the aluminum lines 3. The method for forming the insulating film 4 is described below.

130 g sulfuric acid and 30 g fuming sulfuric acid were placed in a four-mouthed flask with a 1 L capacity. Under normal temperature, 160 g toluene was added dropwise over a 50-minute period, and a reaction was then allowed to occur for 30 minutes. Under normal temperature, a 20 wt % trichlorosilane toluene solution (200 g toluene, 40 g trichlorosilane) was added over a 180-minute period to a toluene solution of the toluenesulfonic acid hydride formed in the previous reaction. The mixture was left to stand for one hour after completing the addition, and the sulfuric acid and toluenesulfonic acid hydride in the bottom layer were removed using a separating funnel.

The material was washed with 70 mL 50 wt % sulfuric acid to precipitate the toluenesulfonic acid hydride. The toluenesulfonic acid hydride was then removed through suction filtration. Washing with sulfuric acid and filtration were conducted one additional time. The solution was neutralized with calcium carbonate and subjected to suction filtration to remove the calcium carbonate. Magnesium sulfate was added, and the solution was left to stand for 12 hours to bring about dehydration. The magnesium sulfate was removed through suction filtration.

The microgel was removed with a filter and dried with a rotary evaporator. The product was dissolved in benzene and freeze-dried.

The acetonitrile-soluble caged molecular structure component was separated from the acetonitrile-insoluble ladder molecular structure component in the powder so obtained. To ascertain the presence of the caged molecular structure, the composition associated with a peak appearing in the low-molecular weight region using a gel permeation chromatograph, can be subjected to IR analysis, for example. Where the material has a ladder molecular structure, absorption peaks appear at wave numbers of 1070 $cm^{-1}$ and 1130 $cm^{-1}$; where it has a caged molecular structure, a single absorption peak appears in the vicinity of the wave number 1130 $cm^{-1}$. The separated caged molecular structure component is treated with nitric acid aqueous solution (100 ppm concentration) to bring about molecular crosslinking. In this way, a polymer essentially comprising of 3000- to 5000-molecular weight caged siloxane which includes the caged molecular structure component is obtained.

20 g of this polymer was dissolved in 80 g methylisobutylketone to prepare a 20 wt % polymer solution. The polymer solution so obtained was filtered through a 0.2 $\mu$m membrane filter to produce a sample polymer solution.

This sample was spin coated, under conditions of 3000 rpm for 30 seconds, onto the substrate provided with the aluminum lines 3 shown in FIG. 1A. These conditions produced a film thickness of approximately 0.8 $\mu$m on the bare silicon substrate. After spin coating, the film was heat treated for three minutes at 250° C.

The film then heat treated in air for one minute at 350° C. During this heat treatment, some of the Si—H in the film were oxidized and converted to Si—OH. Heat treatment was then conducted in an $N_2$ atmosphere ($O_2$ concentration 10 ppm or lower) for 30 minutes at 400° C. During this heat treatment, the Si—OH in the film were crosslinked. The crosslinking produced an insulating film 4 consisting of sparingly solvent-soluble caged siloxane.

Reducing the number of Si—H at the surface of the insulating film 4 has the effect of enhancing water absorbency and increasing the dielectric constant. Accordingly, the heat treatment for converting Si—H to Si—OH should be conducted under conditions such that the hydrogen atom content subsequent to crosslinking is 50 to 80% of that prior to crosslinking.

Figure 1B:
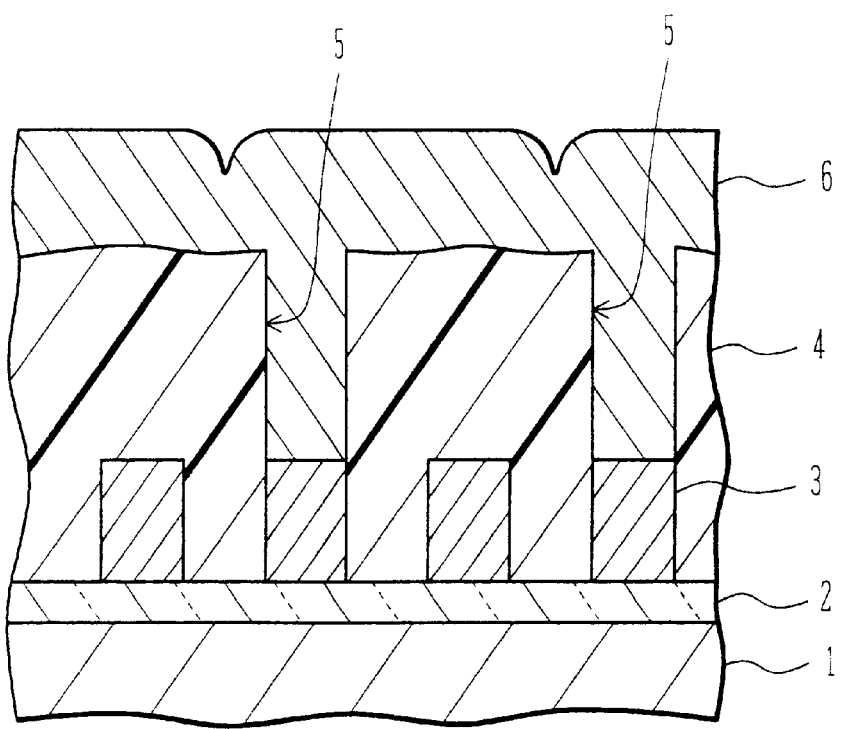

As shown in FIG. 1B, the insulating film 4 is provided with via holes 5 having 0.4 $\mu$m in diameter for exposing portions of the upper surfaces of the aluminum lines 3. Via hole 5 formation can be conducted through reactive ion etching (RIE) using a mixed gas of $CF_4$ and $CHF_3$, for example. A second Al layer 6 is formed through sputtering so as to fill the interiors of the via holes 5, and reflowed at a temperature of 450° C.

Examination of the via hole 5 areas revealed no blackening or void formation. No continuity defects among the lines 3 of the first layer and the lines 6 of the second layer were noted.

Figure 2:
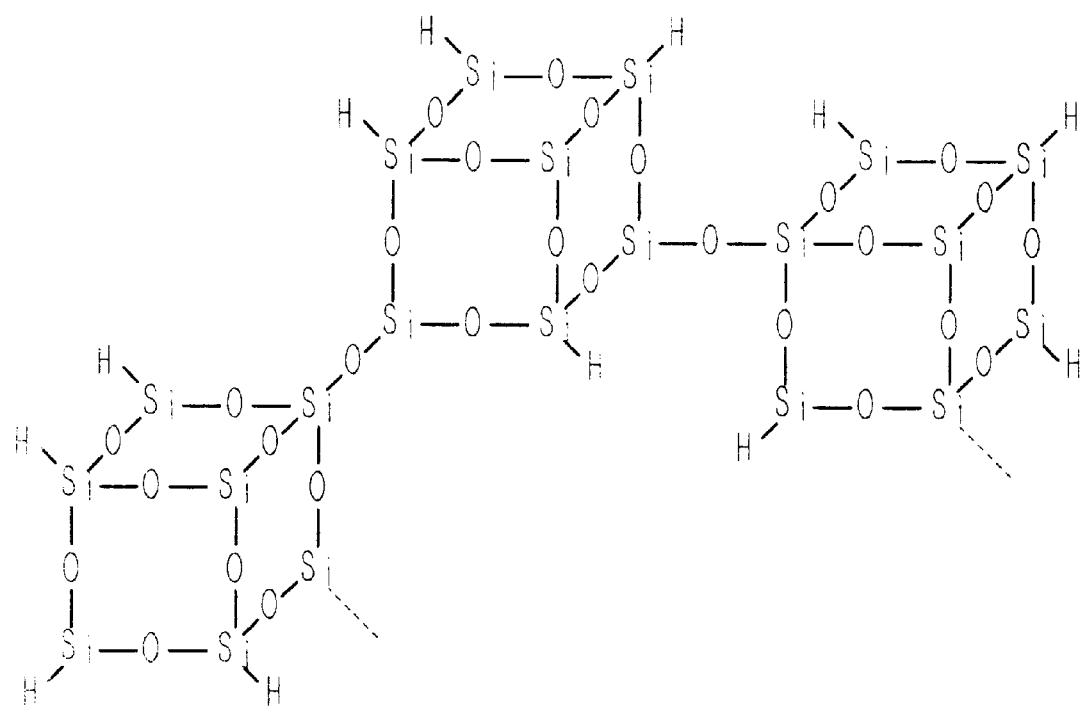
FIG. 2 is a molecular structure diagram showing an example of the molecular structure of caged siloxane.

FIG. 2 depicts an example of the molecular structure of caged siloxane. Caged siloxane consists of caged structural units with Si atoms located at points corresponding to the eight vertices of a cube, and oxygen atoms located at midpoint on each side. Some of the Si atoms in the caged structural units are bonded through O atoms to Si atoms in other caged structural units.

A space with a thin electron cloud is formed in the central portion of each caged structural unit. Thus, the polymer formed by the linked caged structural units can be assumed to have a low dielectric constant. The center of each face comprising the caged structure shell has an opening that is not large enough for a water molecule to pass. Thus, water molecules do not penetrate into the central space in the caged structure. This prevents any rise in the dielectric constant due to penetration by water molecules.

Since the film can be produced by spin coating, making it possible to fill recessed portions on the substrate surface, narrow recessed portions on the substrate surface can be filled in highly reproducible fashion.

As shown in FIG. 1B, the plurality of Al lines 3 are covered with an insulating layer 4 of caged siloxane with a low dielectric constant. Parasitic capacitance between Al lines 3 can be reduced.

In the embodiment described above, the composition associated with a peak appearing in the low-molecular weight region using a gel permeation chromatograph was subjected to IR analysis, and, where no peak was noted in the vicinity of the wave number 1070 $cm^{-1}$, it was verified that the material had a caged molecular structure. Thus, the effects described earlier can be achieved using siloxane that does not produce a peak in the vicinity of the wave number 1070 $cm^{-1}$. It should be noted that even a material containing a certain amount of ladder molecular structure siloxane can provide a lower dielectric constant. In order to produce a lower dielectric constant, it is preferable that the caged molecular structure siloxane constitutes 20 wt % or more, and it is more preferable it constitutes 40 wt % or more.

The method for manufacturing a wiring structure in another embodiment of the present invention will be described, referring to FIGS. 3A through 3C.

Figure 3A:
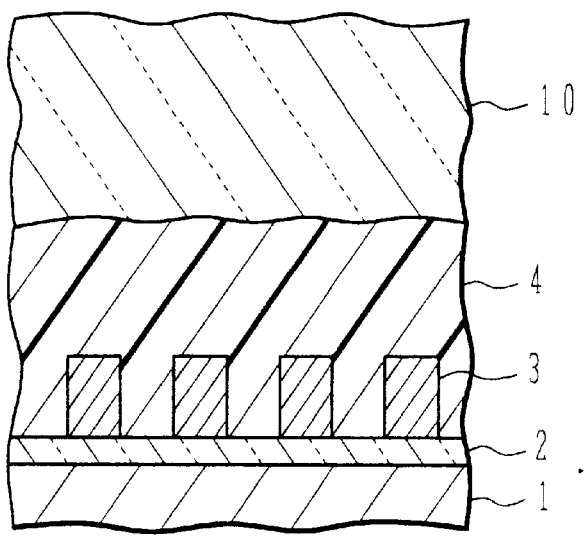
FIGS. 3a through 3C are section views of wiring layers, illustrating the method for manufacturing wiring structure in another embodiment of the present invention.

As shown in FIG. 3A, using a method analogous to the method described with reference to FIG. 1A, an insulating film 4 of 0.8 $\mu$m thick was formed under coatable conditions over the insulating film 2 and Al lines 3 provided to a silicon substrate 1. An $SiO_2$ film 10 approximately 1.5 $\mu$m thick was formed over the insulating film 4 by chemical vapor deposition (CVD) using $SiH_4$ and $O_2$ as source materials, for example.

Figure 3B:
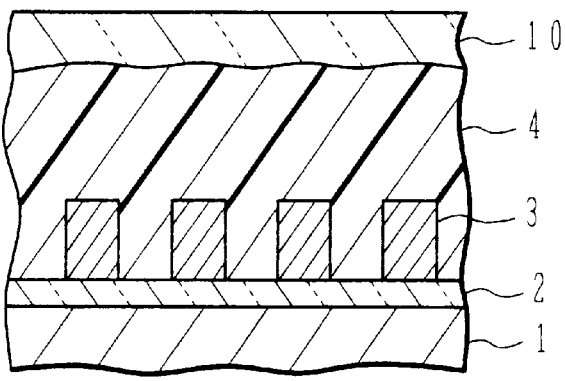

As shown in FIG. 3B, the surface of the $SiO_2$ film 10 was planarized using chemical mechanical polishing (CMP). SS-25 (manufactured by CABOT Co.) can be used as the slurry. This process afforded an interlayer insulating film with a two-layer structure consisting of a caged siloxane insulating film 4 and an $SiO_2$ film 10.

Surface planarization of the caged siloxane insulating film 4 through direct chemical mechanical polishing eliminates the Si—H at the surface, increasing the tendency to absorb moisture. The dielectric constant of the insulating film 4 increases as a result. By forming an $SiO_2$ film 10 over the insulating film 4 and polishing the surface of the $SiO_2$ film 10, the surface can be planarized while maintaining the low dielectric constant of the insulating film 4.

Figure 3C:
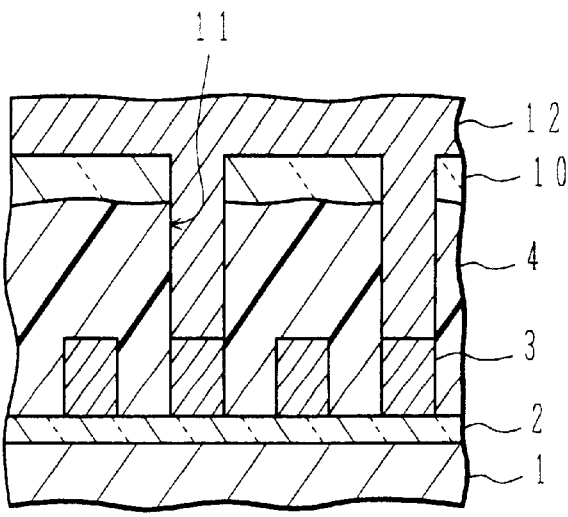

As shown in FIG. 3C, via holes 11 which pass through the two layers consisting of the insulating film 4 and the $SiO_2$ film 10 were formed, and the Al lines 12 of the second layer were deposited. As in the embodiment described with reference to FIGS. 1A and 1B, no blackening or void formation was noted in the via hole 11 areas in this embodiment, nor were continuity defects noted among the lines 3 of the first layer and the lines 12 of the second layer.

In this embodiment as well, the Al lines 3 are covered by an insulating film 4 with a low dielectric constant, thereby reducing parasitic capacitance between Al lines 3, as in the embodiment described with reference to FIG. 1B.

Figure 4:
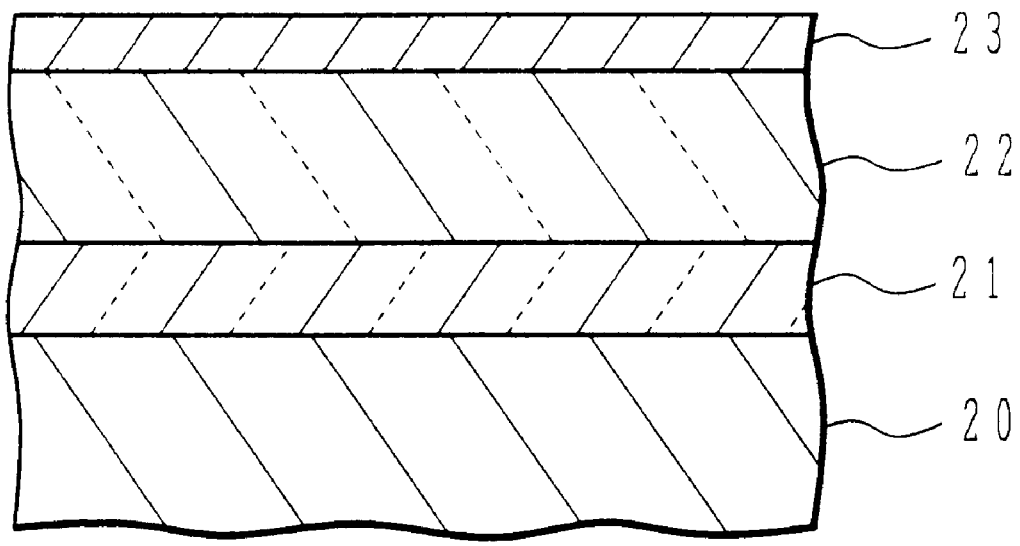
FIG. 4 is a section view of a MOS structure containing an insulating layer consisting of caged siloxane.

FIG. 4 is a section view of a metal/oxide film/semiconductor (MOS) design which includes an insulating layer of caged siloxane. The surface of a doped (boron (B) dose: $5 \times 10^{15}$ $cm^{-2}$) p-type silicon substrate 20 was provided with an insulating film 21 of 0.8 μm thick essentially comprising caged siloxane and an $SiO_2$ film 22 of 1.5 μm thick produced by CVD. The insulating film 21 and the $SiO_2$ film 22 were produced using methods analogous to those used to produce the insulating film 4 and the $SiO_2$ film 10 described with reference to FIG. 3A. A metal film 23 was formed over the $SiO_2$ film 22.

The relative dielectric constant of the insulating film 21 was measured by measuring the capacitance of the MOS design shown in FIG. 4, and found to be approximately 2.3. The relative dielectric constant of the $SiO_2$ film 22 was estimated at approximately 4.2. In this way, the use of a polymer consisting of caged siloxane afforded an insulating film with a low dielectric constant.

Figure 5A:
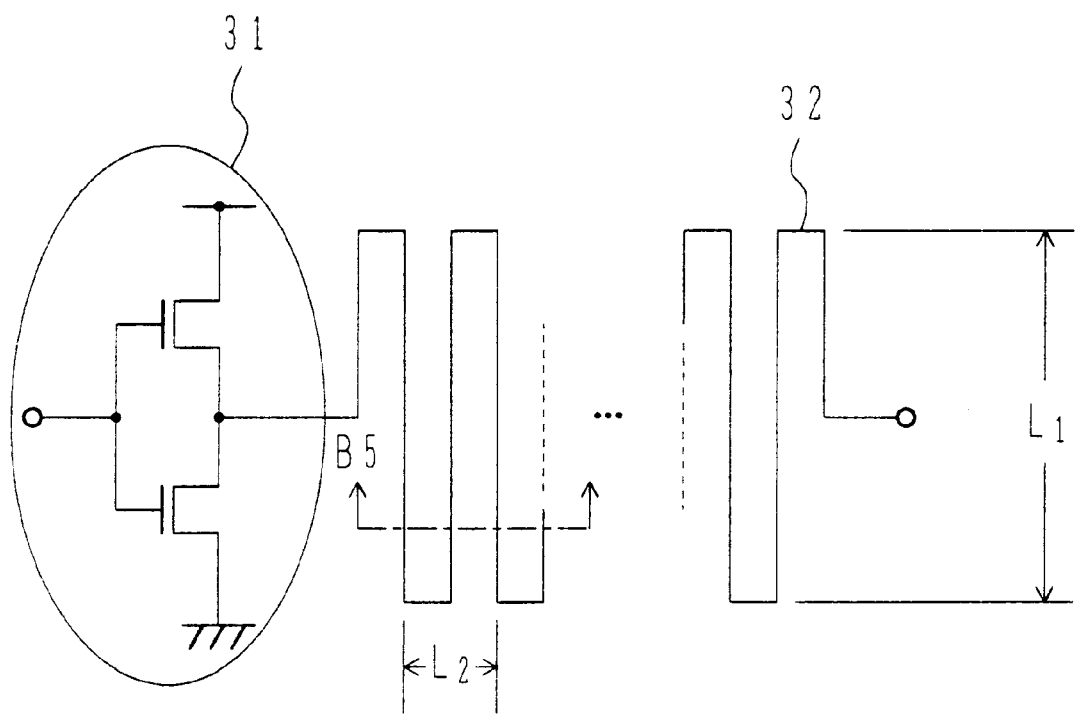
FIG. 5A is a simplified illustration of the first stage of a ring oscillator.
Figure 5B:
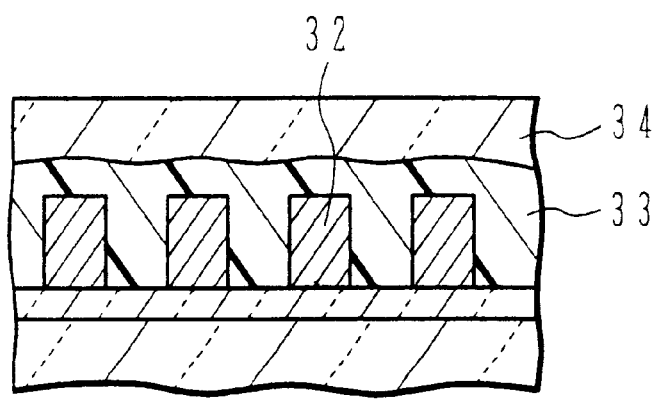
FIG. 5B is a section view of the wiring area in the ring oscillator.

FIGS. 5A and 5B show a ring oscillator which employs an insulating film consisting of caged siloxane. FIG. 5A is a simplified illustration of one stage of the ring oscillator. FIG. 5B is a section view along the dotted line B5—B5 in FIG. 5A. One stage of the ring oscillator comprises a CMOS inverter 31 and an Al line 32 connected to the output terminal thereof. The line 32 is laid out in a zigzag and connected to the inverter input terminal of the next stage. The total length of the line 32 is 450 μm; the distance $L_1$ from one bend to the adjacent bend is 30 μm. The pitch $L_2$ is 1.0 μm, the line 32 width is 0.5 μm, and the thickness is 0.6 μm. The Al line 32 is covered with a dielectric film 33 consisting of caged siloxane, and an $SiO_2$ film 34 is formed thereupon. The distance from the top surface of the line 32 to the top surface of the $SiO_2$ film 34 in the direction of thickness is 0.5 μm. The ring oscillator comprises 100 stages connected in series, one stage of which is shown in FIG. 5A.

The oscillation frequency of the ring oscillator having the design depicted in FIGS. 5A and 5B was compared with the oscillation frequency of a ring oscillator employing only a CVD-produced $SiO_2$ film as the interlayer insulating film in FIG. 5B; a speed improvement of approximately 20% was noted. This is attributed to a reduction in parasitic capacitance by the line 32 shown in FIG. 5A.

In the foregoing embodiment, the use of a polymer consisting of caged siloxane was described, but it would be possible to use other low-dielectric constant compositions having caged molecular structures. For example, a caged hydrocarbon such as a fullerene structure could be used for the insulating film material.

The composition used should have a structure such that the caged molecular structural unit shells do not allow water molecules to pass. By preventing penetration of water molecules, an increase in the dielectric constant can be prevented. Where caged siloxane is used, the atom rings which constitute the caged molecular structure shells consist of eight atoms. It is preferable to use a composition in which the number of atoms in each atom ring is 12 or less in order to prevent water molecules from penetrating into the central spaces in the caged structural units.

Each caged structural unit of caged siloxane has a point symmetrical structure. It is preferable that each caged structural unit has a point symmetrical structure like the caged siloxane in order to form an insulating film having a low dielectric constant.

In the above embodiment, a polymer produced by crosslinking caged siloxanes is used as an insulating film. A low dielectric component having a caged molecular structure like a caged siloxane may be bound by a binder polymer. Ladder molecular structure silsesquioxane, polyimide resins, benzocyclobutene (BCB, manufactured by Dow Chemical Co.), and the like can be used as binders.

The present invention was described above through embodiments, but the invention is in no way limited thereto. It should be apparent to one skilled in the art that various modifications, improvements, combinations, and the like are possible.

We claim:

1. A semiconductor integrated circuit device, comprising:
   a substrate having a plurality of lines formed on its principal surface; and
   an insulating film which contains an insulating composition with caged molecular structural units, formed on the principal surface of the substrate such as to cover the lines, the caged molecular structural units including Si atoms located at points corresponding to the eight vertices of a cube, and twelve O atoms, each O atom located at a midpoint of each side of the cubic structure, wherein structural units are combined with each other through an oxygen atom.

2. The semiconductor integrated circuit device according to claim 1, wherein content of the insulating composition with the caged molecular structural units in the insulating film is 20 wt % or above.

3. The semiconductor integrated circuit device according to claim 1, wherein a shell of each of the caged molecular structural units has a structure such that water molecules do not penetrate into a space within the caged molecular structural unit.

4. The semiconductor integrated circuit device according to claim 1, wherein the insulating film includes a binder polymer for binding the low-dielectric constant composition.

5. The semiconductor integrated circuit device according to claim 1, further comprising:
   an additional insulating layer produced from an inorganic material, disposed over the aforementioned insulating film.

* * * * *